United States Patent [19]

Bierhoff et al.

[11] Patent Number: 5,105,249
[45] Date of Patent: Apr. 14, 1992

[54] RADIATION-SENSITIVE SEMICONDUCTOR DEVICE HAVING A TRANSISTOR

[75] Inventors: Martinus P. M. Bierhoff; Job F. P. van Mil, both of Eindhoven, Netherlands

[73] Assignee: U.S. Philips Corporation, New York, N.Y.

[21] Appl. No.: 744,678

[22] Filed: Aug. 9, 1991

Related U.S. Application Data

[63] Continuation of Ser. No. 525,276, May 17, 1990, abandoned.

[30] Foreign Application Priority Data

Jun. 2, 1989 [NL] Netherlands .................... 8901400

[51] Int. Cl.$^5$ ...................... H01L 27/14; H01L 29/72; H01L 27/10; H01L 27/02
[52] U.S. Cl. .......................... 357/30; 357/34; 357/45; 357/46
[58] Field of Search ........... 357/30, 46, 34, 45; 280/370.01

[56] References Cited

U.S. PATENT DOCUMENTS

| | | | |
|---|---|---|---|
| 3,693,029 | 9/1972 | Niven, Jr. ............... | 250/370.01 |
| 3,925,879 | 12/1975 | Weinstein ............... | 357/30 |
| 4,137,428 | 1/1979 | Federico ............... | 307/117 |
| 4,456,920 | 6/1984 | Iesaka ............... | 357/46 |
| 4,469,945 | 9/1984 | Hoeberechts et al. ....... | 250/370 |
| 4,810,871 | 3/1989 | Opheij ............... | 250/201 |
| 4,905,069 | 2/1990 | Shigekane ............... | 357/46 |

FOREIGN PATENT DOCUMENTS

| | | | |
|---|---|---|---|
| 58-092263 | 6/1983 | Japan ............... | 357/46 |
| 59-193322 | 11/1984 | Japan ............... | 357/46 |
| 62-083776 | 10/1988 | Japan ............... | 357/46 |
| 63-299583 | 12/1988 | Japan ............... | 357/46 |
| 63-118782 | 11/1989 | Japan ............... | 357/46 |
| 2201543 | 9/1988 | United Kingdom ...... | 357/30 P |

OTHER PUBLICATIONS

Sze, "Physics of Semiconductor Devices", pp. 783-787, ©1981.

*Primary Examiner*—Mark Prenty
*Attorney, Agent, or Firm*—Steven R. Biren

[57] ABSTRACT

The invention relates to a semiconductor device comprising a radiation-sensitive element (A ... D). The radiation-sensitive element includes a transistor (T) having an emitter region (6), a base region (4) and a collector region (2), and further a radiation-sensitive region (7) having a rectifying junction (5). Due to the presence of the transistor (T), such an element (A ... D) can supply a considerably larger output signal than a photodiode. On the contrary, however, the first-mentioned element (A ... D) is comparatively slow as compared with a photodiode due to the parasitic capacitance of the rectifying junction (5). The invention obviates this disadvantage in that according to the invention the radiation-sensitive region (7) has at least a first subregion (71) and a second subregion (72) and the transistor (T) is subdivided into two subtransistors ($T_1$, $T_2$), whose base regions (4) are separately connected to the subregions (71, 72). The collector regions (2) and the emitter regions (6) of the subtransistors ($T_1$, $T_2$) are interconnected.

9 Claims, 5 Drawing Sheets

RADIATION-SENSITIVE SEMICONDUCTOR DEVICE HAVING A TRANSISTOR

This is a continuation of application Ser. No. 525,276, filed May 17, 1990 and now abandoned.

BACKGROUND OF THE INVENTION

The invention relates to a semiconductor device comprising a semiconductor body provided with a radiation-sensitive element comprising a transistor having an emitter region and a collector region of a first conductivity type and an interposed base region of a second, opposite conductivity type and comprising a radiation-sensitive region having a rectifying junction, which is conductively connected to the base region of the transistor.

From the handbook: "Physics of Semiconductor Devices, Second Ed.; p. 784" of S. M. Sze, such a semiconductor device is known, in which the radiation-sensitive element comprises a phototransistor. The base region of the transistor is constituted by a p-type semiconductor zone, which is provided in an n-type silicon substrate. The substrate itself serves as collector region of the transistor. An n-type emitter region of the transistor is located in the base region. During operation a depletion region is situated around the pn junction between the base region and the collector region, which constitutes the photosensitive region of the device.

A semiconductor device of the kind mentioned above is used to convert radiation into an electrical signal. The signal produced can then be further processed electronically. Especially in recent years the possibilities of use of such devices have increased, such as, for example, in the optical telecommunication and in the optical or magnetooptical recording and reading of information on an information carrier, designated briefly hereinafter as optical recording, such as, for example, DOR (Direct Optical Recording), CD (Compact Disk), VLP and computer applications, such as CDROM/CDI.

The use of radiation-sensitive diodes for reading a CD is described in Philips Technical Review, Vol. 40, 1982, No. 6, pp. 148 ff. There, a system of four adjacent photodiodes is used for reading the CD. The information is stored on the CD in tracks, which are scanned by a laser beam. In the reflected beam, the information is represented by intensity variations, which are detected by the diodes and are converted into an electrical signal.

A radiation-sensitive element having a radiation-sensitive transistor instead of a diode has the great advantage that a considerably larger output signal can be obtained. In a photodiode, the output signal is limited to the photocurrent produced, whereas in a transistor with a suitable amplification factor the output signal can be many times larger. However, a radiation-sensitive transistor generally has a considerably lower (detection) speed than a radiation-sensitive diode having an equally large radiation-sensitive surface. Due to the parasitic capacitance of the radiation-sensitive junction of the transistor, the transistor can no longer follow adequately the optical signal at higher frequencies. This renders such a transistor unsuitable for high-frequency applications, such as optical recording. For example, with CD, the information carrier is read out at a speed of more than 1 m/s, which means that the reflected beam can vary in intensity well over a million times per second.

SUMMARY OF THE INVENTION

The invention has inter alia for its object to provide a semiconductor device of the kind mentioned above comprising a radiation-sensitive element which is also suitable for high-frequency applications, such as optical recording, and which moreover can supply a comparatively high output signal.

According to the invention, a semiconductor device of the kind mentioned above is characterized in that the radiation-sensitive region comprises at least a first subregion and a second subregion, and in that the transistor is subdivided into at least two subtransistors, whose base regions are separately connected to the subregions and whose collector regions and emitter regions are interconnected.

The overall radiation-sensitive surface of the element is constituted by the sum of the surfaces of the subregions. This surface can be used in optical recording to trap the laser beam when it has not (yet) been focused on the information carrier. For trapping the beam, the radiation-sensitive surface must have a given minimum size, which renders the known radiation-sensitive element too slow for high-frequency applications, due to its parasitic capacitance. The invention is based on the recognition of the fact that during trapping the beam is comparatively wide and covers a large part of the radiation-sensitive surface, while, when in focus, it is narrower and is directed only to a limited part of the overall radiation-sensitive surface. According to the inention, the parasitic capacitance of the element can be limited to the capacitance of the last region. The region to which the beam in focus is directed lies in the second subregion, which according to the invention is isolated from the first subregion. The parasitic capacitance of the element is then limited to the capacitance of the second subregion. The other, first subregion in fact receives in this condition substantially no radiation and thus substantially does not supply any photocurrent. The transistor associated with this subregion is thus constantly blocked in this condition so that the capacitance of the first subregion cannot adversely affect the speed of the element. In focus, the information carrier is read with the second subregion, in which event the capacitance of the second region can be sufficiently small so that intensity variations in the laser beam can be followed up to very high frequencies, for example of the order of 1 to 2 MHz. Moreover, due to the higher intensity of the beam in this condition, the photocurrent produced by the second subregion need not be smaller, in spite of the smaller surface thereof, than the photocurrent of the overall radiation-sensitive surface during trapping of the beam.

The radiation-sensitive element in the device according to the invention is particularly suitable for use in a combined reading and focusing system of an arrangement for optical recording, such as, for example, the Foucault system of a CD player described in the aforementioned article from Philips Technical Review. In a particular embodiment, the device according to the invention in this case comprises at least a second similar radiation-sensitive element, the radiation-sensitive subregions of the two elements being arranged in a row, in which the outer subregions are first subregions and the inner subregions are constituted by second subregions. From the difference between the output signals of the two radiation-sensitive elements a so-called focus error signal can be derived, which is used as control signal for focusing the laser beam on the CD. The sum of the output signals constitutes the reading signal and represents the information stored on the CD. The system is designed so that in focus the laser beam is directed substantially only to the inner second subregions of the row.

In a further embodiment, the device according to the invention is characterized in that opposite to the row on a longitudinal side thereof is arranged an at least substantially similar second row of radiation-sensitive subregions of a third and a fourth radiation-sensitive element. By the addition of the second row of elements it is possible to produce besides a reading signal and a focus error signal also a so-called tracking signal, by means of which the laser beam can be held in the information track. The tracking signal is constituted by the difference between the output signals of the first row and the second row of elements.

For an accurate adjustment of the laser it is important that the characteristics, such as especially the amplification factors, of the various transistors are as equal as possible. This is mainly achieved in that the configurations of the transistors are chosen to be as identical as possible. In practice, it has been found, however, that this is not sufficient. Due to local process fluctuations over the semiconductor body during the manufacture of the device, in spite of their identical configurations, the transistors can nevertheless exhibit differences. These differences are smaller as the transistors are located at a smaller relative distance in the semiconductor body. A further embodiment of a semiconductor device according to the invention is characterized in that the base regions of the radiation-sensitive elements comprise the radiation-sensitive subregions and in that the emitter regions are located in the base regions on the facing longitudinal sides of the rows. In this case, the emitters and hence the active parts of the transistors are located at a comparatively small relative distance, as a result of which the properties of the various transistors are very nearly equal.

In another embodiment, the device comprises at least two radiation-sensitive elements, whose base regions and radiation-sensitive subregions are located in the semiconductor body so as to be mutually separated, the base regions being arranged on an average more closely to each other than the radiation-sensitive subregions. Thus, the transistors of which the base regions form part can be located very closely to each other in order thus to strongly reduce or even to exclude the influence of process fluctuations on the operation of the device. The radiation-sensitive regions, which are separately connected to the base regions and supply the base current for these regions, can be arranged at a suitable area in the semiconductor body, in dependence upon the focusing system and the associated optical system.

BRIEF DESCRIPTION OF THE DRAWING

The invention will now be described more fully with reference to several embodiments and the drawings in which.

Figure 1:
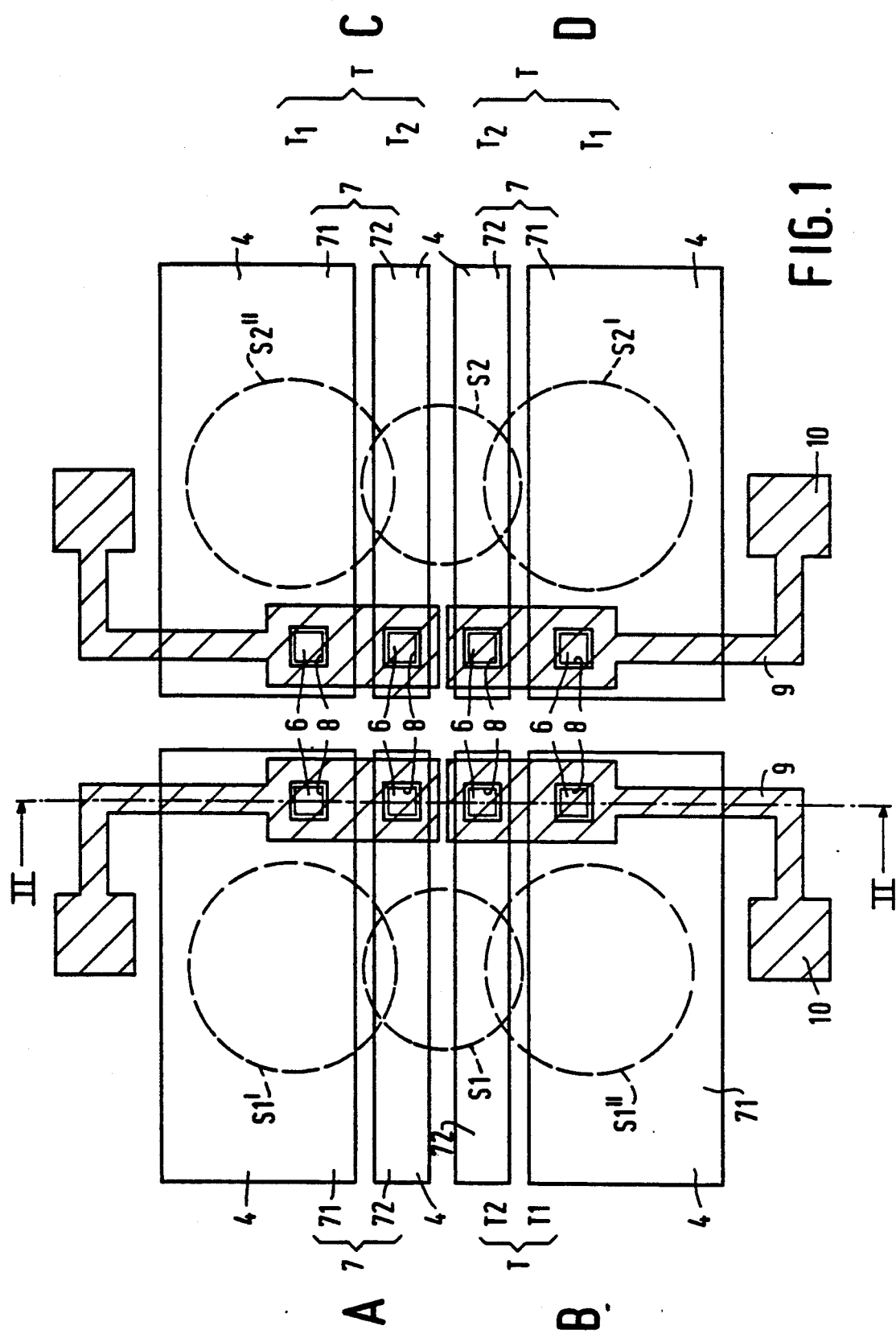
FIG. 1 is a plan view of a first embodiment of a semiconductor device according to the invention.

The Figures. are purely schematic and not drawn to scale. More particularly, certain dimensions are exaggerated for the sake of clarity. As far as possible, in the drawings semiconductor regions of the same conductivity type are cross-hatched in the same direction and corresponding parts are designated by the same reference numerals.

DESCRIPTION OF THE PREFERRED EMBODIMENTS

Figure 2:
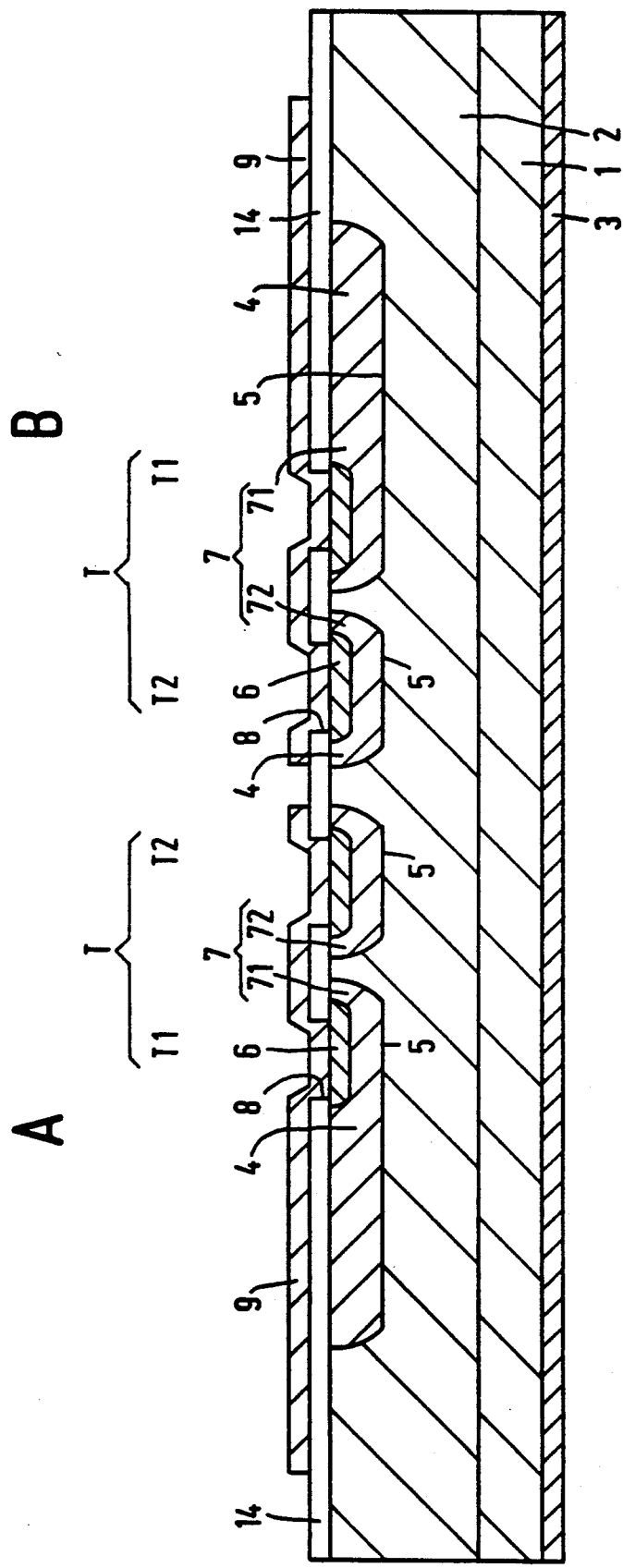
FIG. 2 shows the semiconductor device of FIG. 1 in a cross-section taken on the line II—II.

In FIG. 1, the semiconductor device according to the invention comprises four radiation-sensitive elements A, B, C, D, which are arranged in two opposite rows in a semiconductor body. One of the two rows is also shown in FIG. 2 in a cross-section taken on the line II—II.

The semiconductor body in this embodiment comprises an n-type silicon substrate 1, on which an epitaxial layer 2 is formed, which is of the same conductivity type, but has a low doping concentration. The substrate 1 is provided on the lower side with an electrode 3 in the form of a metal layer.

The elements A, B, C, D are provided with a radiation-sensitive region 7 having a rectifying junction 5, which is capable of converting incident radiation into a photocurrent. The output signal of the element A, B, C, D is supplied via a conductor track 9 to a contact surface 10, at which it can be derived to be further processed electronically outside the arrangement. However, it is also possible to integrate the electronic circuit required for processing entirely or in part in the semiconductor body, the conductor tracks extending not to the contact surfaces 10, but to the inputs of the circuit. The device in the present embodiment is particularly suitable for use in a so-called Foucault focusing system, for example that of a compact disk player as described in the aforementioned article from Philips Technical Review. In the system described herein, a carrier on which information is stored in tracks is scanned by a laser beam. The reflected beam is split up by means of a prism into two subbeams, which are each supplied to two adjacent radiation-sensitive elements. The information stored on the carrier is represented in the reflected beams by intensity variations. With CD, where the carrier is scanned at a speed of well over 1 m/s, the reflected beam varies about a million times per second.

In FIG. 1, the subbeams are indicated diagrammatically as circles $S_1$, $S_2$. The circles $S_1$ and $S_2$ designate the first and the second subbeam, respectively, when the system has been focused on the information carrier. By means of the system of radiation-sensitive elements A, B, C, D, the intensity variations can be converted into an electric signal $I_L$. This reading signal $I_L$ is constituted by the sum of the reading signals $I_A$, $I_B$, $I_C$, $I_D$ of the various elements, i.e. $I_L = I_A + I_B + I_C + I_D$.

Moreover, two control signals: a so-called focus error signal and a tracking signal, can be derived from the output signals of the elements A, B, C, D, while the reading beam can be trapped and can be focused on the information carrier and can be held in the track to be read, respectively. For illustration, in the Figure the circles $S_1'$, $S_2'$ and $S_1''$, $S_2''$ are shown, which indicate the subbeams in case the focusing plane of the system lies above and below the plane of the information carrier, respectively. The focus error signal $I_F$ is obtained from the difference between the output signal of the elements A, D and the output signal of the elements B, C, i.e. $I_F=(I_A+I_D)-(I_B+I_C)$. When the reading beam moves out of the track, the intensity of the first subbeam $S_1$ will differ from that of the second subbeam so that the tracking signal $I_S$, i.e. $I_S=(I_A+I_B)-(I_C+I_D)$, can be derived from the difference between the output signal of the first set of transistors A, B and that of the second set C, D.

Especially for these control signals, it is desirable that the elements A, B, C, D have a high output signal, i.e. an output signal many times larger than the photocurrent produced. When the laser beam is substantially in the ideal position, the difference signals $I_F$ and $I_S$ are otherwise so small that it is hardly possible to readjust the laser further. In order to amplify the photocurrent produced, the elements A, B, C, D are each provided with a transistor T.

The transistors T each have a p-type base region 4 and an n-type emitter region 6 disposed therein. The n-type epitaxial layer 2 constitutes a collector region common to all substransistors T. The transistors may be arranged in the semiconductor body so as to be separated from the radiation-sensitive regions 7, but may also be merged therewith, as is the case here. In this case, the base region 4 of the transistor T comprises the associated radiation-sensitive region 7. Thus, the transistors do not occupy an additional amount of space.

The assembly is covered by an isolating layer 14 of silicon oxide, in which contact windows 8 are provided at the area of the emitter regions 6. Via the contact windows 8, the emitter regions 6 are connected to a contact surface 10 by means of an aluminum conductor track 9.

During operation, a positive voltage of, for example, 5 V is applied to the collector electrode 3 and the emitter regions 6 are connected to ground. The base regions 4 are not connected and float. The rectifying junction 5 of the radiation-sensitive region 7, which in this case coincides with the base-collector junction of the transistor T, is then surrounded by a depletion region. When radiation is incident upon the radiation-sensitive region 7 and penetrates into the depletion region, hole-electron pairs can be generated in the depletion region under the influence thereof. The electrical field prevailing in the depletion region ensures that the generated holes are conducted away to the base region 4 of the transistor. The photocurrent $I_f$ thus produced yields a base current for the transistor T, which reduces the potential between the emitter region 6 and the base region 4. With a sufficient quantity of radiation, the transistor T becomes conducting. A current $IT=(1+h_{FE})$. $I_f$ then flows through the transistor, where $h_{FE}$ represents the amplification factor of the transistor T. At a suitable value of the amplification factor $h_{FE}$, the transistor T can convey a current which is many times larger than the photocurrent $I_f$ produced.

A disadvantage of the known radiation-sensitive element with a transistor, however, is that due to the transistor the element follows the signal much more slowly than a radiation-sensitive diode having an equally large radiation-sensitive surface. A variation of the voltage of the base region with respect to the emitter and hence of the output signal is constantly counteracted by the capacitance of the rectifying junction of the radiation-sensitive region, i.e. the base-collector junction. Accordingly, as (the capacitance of) this junction becomes larger, the element operates more slowly. Although the speed of the element can be increased by reducing the surface of the radiation-sensitive junction, more stringent requirements are then imposed on the alignment of the radiation to be detected on the radiation-sensitive surface, which is not always permissible. For example with optical recording, a certain minimum size of the radiation-sensitive surface is required to be able to trap the laser beam when it has not (yet) been focused on the information carrier. For example, in order to be able to follow the 1 MHz signal of a CD arrangement, the radiation-sensitive surface would have to be reduced to such an extent that it is no longer possible to trap the laser beam. Hitherto, use had therefore to be made of radiation-sensitive diodes, which operate sufficiently rapidly, but at the expense of the height of the output signal. In fact, in photodiodes the output signal is always limited to the photocurrent produced.

The invention provides a radiation-sensitive element A, B, C, D, which operates sufficiently rapidly so that up to high frequencies of more than a few MHz an optical signal can be read, of which the overall radiation-sensitive surface can be sufficiently large to trap, as in optical recording, a laser beam not (yet) focused and which moreover can supply an output signal many times higher than that of a photodiode having an equally large radiation-sensitive surface. Thus, the device according to the invention is particularly suitable for optical recording.

According to the invention, the radiation-sensitive region 7 of the element A, B, C, D is subdivided into at least a first subregion 71 and a second subregion 72, which are located in the semiconductor body 2 so as to be isolated from each other. Moreover, according to the invention, the transistor T of the element A, B, C, D is subdivided into two subtransistors $T_1$ and $T_2$. The transistors $T_1$, $T_2$ have a common collector region in the form of an n-type epitaxial layer 2 and separated p-type base regions 4 with an n-type emitter region 6 disposed therein. In this embodiment, the radiation-sensitive subregions 71, 72 form part of the respective base regions 4 of the subtransistors $T_1$ and $T_2$ so that with the subdivision of the radiation-sensitive region 7 implicitly the transistor T is subdivided into two subtransistors $T_1$, $T_2$. Per element, the emitter regions 6 of the subtransistors $T_1$, $T_2$ are interconnected by means of the conductor track 9, which also provides for the connection with the contact surface.

In this embodiment, the radiation-sensitive subregions 71, 72 of the elements A, B, C, D, are arranged in at least substantially identical rows. The rows are arranged opposite to each other on their longitudinal side. Within a row, the outer radiation-sensitive subregions are constituted by first subregions 71. The smaller inner subregions in the row are second subregions 72.

The overall radiation-sensitive surface of an element A, B, C, D is constituted by the sum of the surfaces of the radiation-sensitive subregions 71, 72 thereof. This overall surface may be used, for example, in optical recording to trap the laser beam S', S" when the latter has not (yet) been focused on the information carrier. The element need not operate rapidly and the laser beam S', S" is comparatively wide and covers a comparatively large part of the radiation-sensitive surface 71, 72.

When once in focus, the beam S is narrower and is only directed to a limited part of the overall radiation-sensitive surface 71, 72. In the device according to the invention, the latter part falls at least for the major part within the second subregion 72. In focus, the parasitic capacitance of the element A, B, C, D is thus limited to the capacitance of the second subregion 72. In this condition, the first subregion 71 substantially does not receive any radiation and does not supply base current, as a result of which the first subtransistor remains constantly blocked. In this condition, the optical signal is read. The second subregion 72 can be chosen to be sufficiently small so that the element can adequately follow a supplied optical signal up to very high frequencies, such as, for example, the reflected laser beam from a CD arrangement. Moreover, due to the smaller cross-section of the beam, in this condition its average intensity is higher. Per unit radiation-sensitive surface, a larger photocurrent can thus be produced so that in spite of the smaller surface of the second subregion 72 as 72, compared with the overall radiation-sensitive surface 71+72, the photocurrent produced in the element can be sufficiently large.

The output signal of an element A, B, C, D is constituted by the sum of the output signals of its subtransistors $T_1$, $T_2$, which in focus can be simplified to the output signal of only the second subtransistor $T_2$ because then only the second subregion 72 is exposed. The subtransistors $T_1$, $T_2$ ensure that the photocurrent produced in the radiation-sensitive subregion 71 and 72, respectively connected thereto is amplified. The amplification factor $h_{FE}$ of the subtransistors $T_1$ and $T_2$ is in this embodiment about 15, as a result of which the output signal of the element A, B, C, D is about 16 times larger than the photocurrent produced therein.

It will be apparent from the given derivation for the control signals $I_F$ and $I_S$ that these signals are a reliable representation of the position of the laser beam only if the elements have the same electrical properties, more particularly the same amplification factors $h_{FE}$. In order to satisfy this requirement, elements A to D are used which are as identical as possible. Nevertheless, in practice mutual differences may still occur. Due to local fluctuations in the different stages of manufacture, all or substantially all properties of the elements will have a certain spread. According as the elements A, B, C, D are located at a greater relative distance, the deviations of this kind are larger. In order to counteract this, in the present embodiment, the emitter regions 6 are arranged in the facing sides of the rows in the base regions 4. The most active parts of the transistors $T_1$, $T_2$ of the elements A to D are thus located comparatively closely to each other, as a result of which the device is less sensitive to local process fluctuations.

Figure 3:
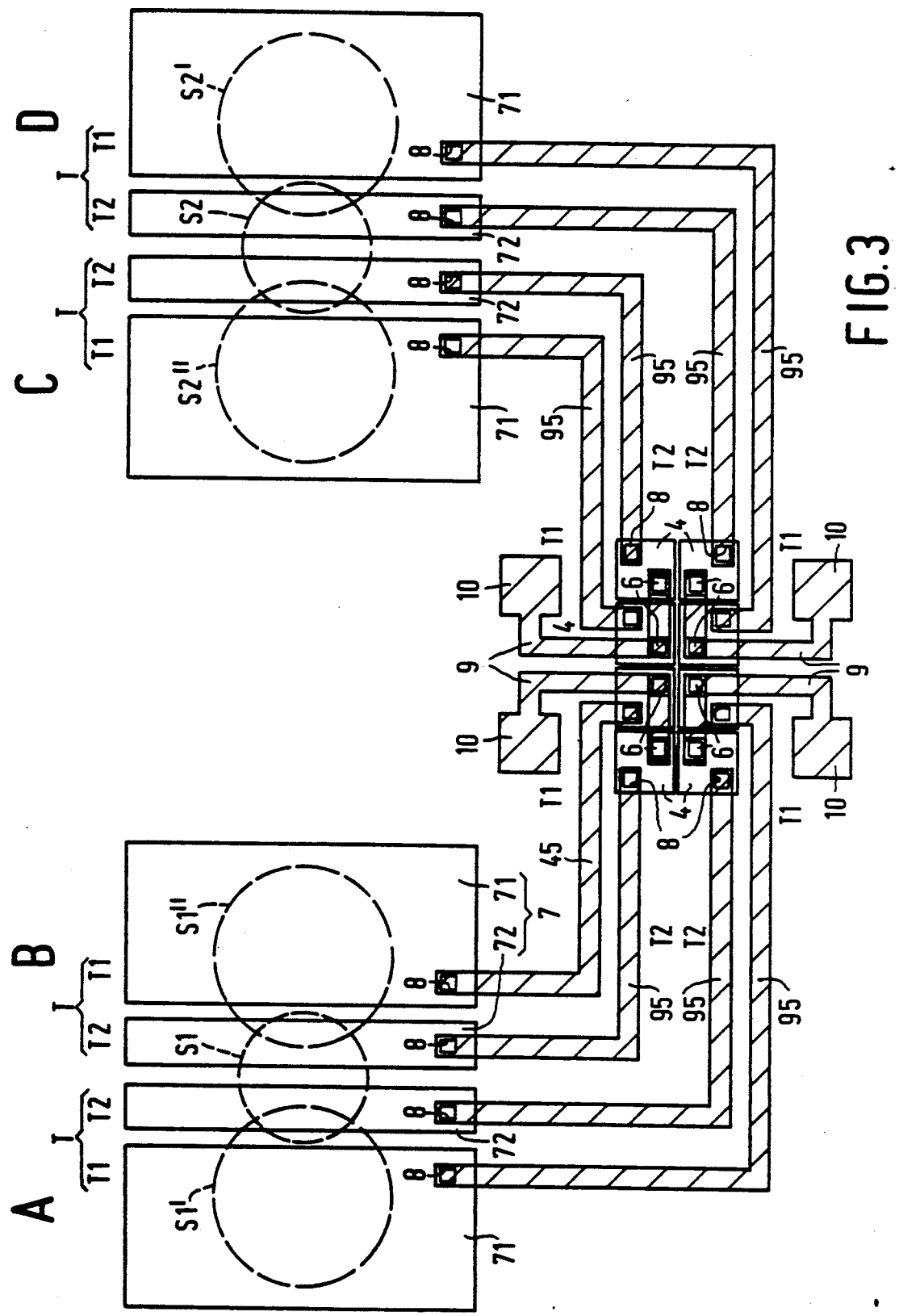
FIG. 3 shows a second embodiment of the semiconductor device according to the invention in plan view.

FIG. 3 shows a second embodiment of the semiconductor device according to the invention. The device in this case also comprises four practically identical radiation-sensitive elements A, B, C, D, which are arranged in an n-type semiconductor body 1. The device comprises also in this case four substantially identical radiation-sensitive elements A, B, C, D, which are arranged in an n-type semiconductor body 1. The elements A, B, C, D are each provided with a p-type radiation-sensitive region 7, which is subdivided according to the invention into a first subregion 71 and a second subregion 72. The subregions 71, 72 each form a rectifying pn junction 5 with the adjoining part of the semiconductor body 1 and are arranged in two substantially identical rows beside each other. The elements A, B, C, D further each comprise a transistor T, which is subdivided according to the invention into two subtransistors $T_1$, $T_2$ both having a p-type base region 4 (which regions are isolated from one another), an n-type emitter region 6 disposed therein and a common n-type collector region constituted by the semiconductor body 1. The emitter regions 6 of the elements A..D are connected by means of a conductor track 9 to a contact surface 10.

In contrast with the first embodiment, in the present embodiment the radiation-sensitive subregions 71, 72 and the subtransistors $T_1$, $T_2$ are located in the semiconductor body 1 so as to be mutually separated. The subtransistors $T_1$, $T_2$ of the various elements A..D are located in the semiconductor body 1 as closely to each other as possible in order to make mutual differences due to spreads in the manufacturing process over the semiconductor body as small as possible. The radiation-sensitive subregions 71, 72 are located on an average at a greater relative distance and are connected each through separate conductor tracks 95 to the base region 4 of one of the subtransistors $T_1$ and $T_2$, respectively, of the elements A..D.

Also in this embodiment, the semiconductor device is particularly suitable for a Foucault focusing system of, for example, an arrangement for optical recording. The device can then be operated in the same manner as the first embodiment. Especially the same equations apply to the reading signal and the two control signals as in the first embodiment.

The radiation-sensitive subregions 71, 72 are positioned so that in focus the subbeams $S_1$, $S_2$ are incident substantially solely upon the inner second subregions 72 of the two rows. In this condition, the information carrier can be read and the parasitic capacitance of an element A..D is limited to the capacitance of the second radiation-sensitive subregion 72 thereof. For trapping the subbeams $S_1'$, $S_2'$ and $S_1''$, $S_2''$, respectively, when the laser is focused above and below the surface of the information carrier, respectively, both subregions $T_1$, $T_2$ can be used.

Figure 4:
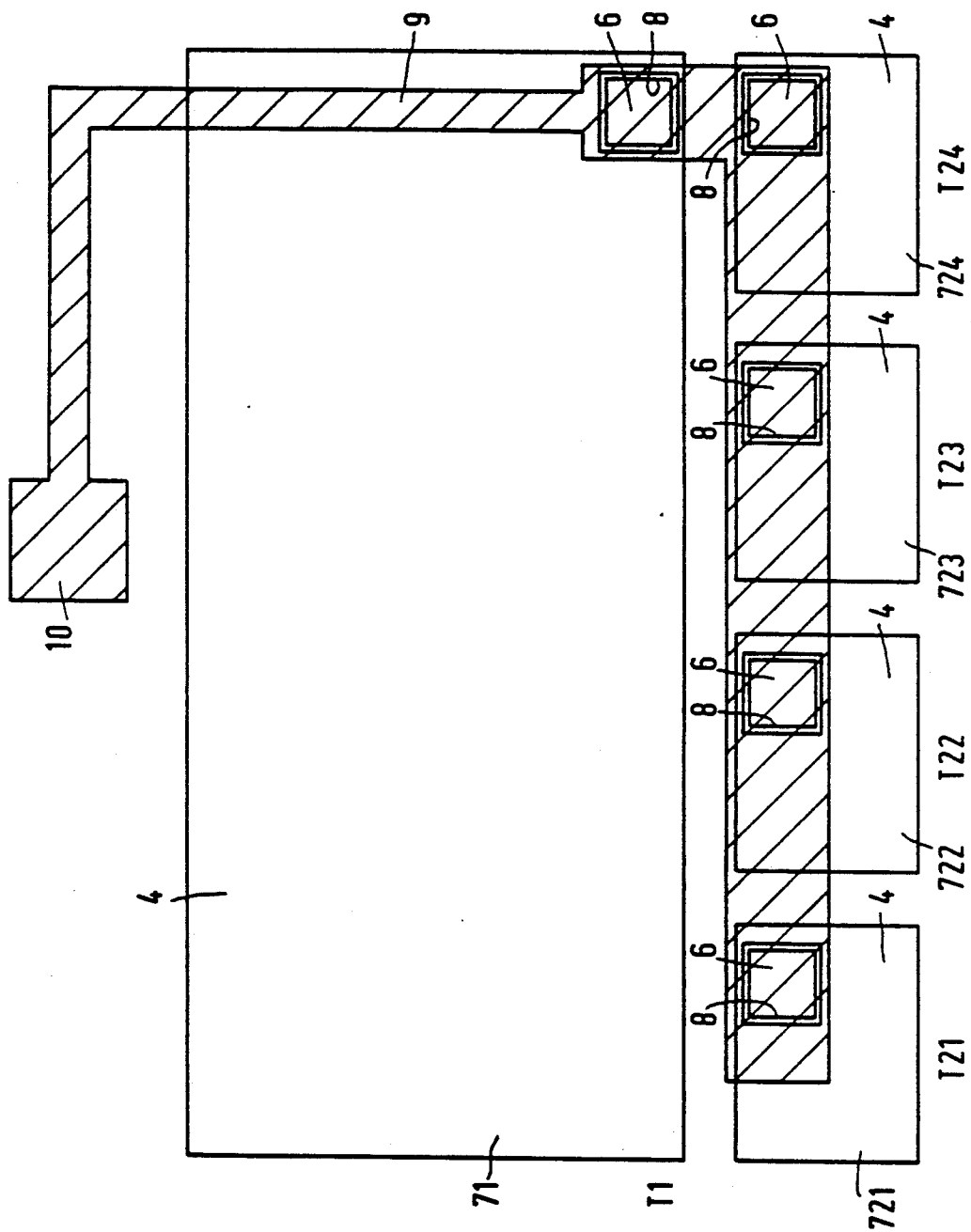
FIG. 4 is a plan view of a third embodiment of the semiconductor device according to the invention.

The parasitic capacitance of the element A, B, C, D can be reduced not only by reducing the second subregion 72, but according to the invention also by further subdividing the second subregion 72 for example as in a third embodiment of the semiconductor device. FIG. 4 shows a third embodiment with a radiation-sensitive element A having a radiation-sensitive region, which is subdivided according to the invention into a first subregion 71 and a second subregion 72. In this embodiment, according to the invention the second subregion 72 is subdivided into four further subregions 721 . . . 724, which are arranged in the semiconductor body so as to be isolated from each other. The subregions 71, 721 . . . 724 each form with the adjoining part of the semiconductor body a rectifying pn junction 5, which is capable of converting incident radiation into an electrical signal. For amplification of this signal, the element A is provided with a transistor, which in this case is subdivided according to the invention into five subtransistors $T_1$, $T_{21}$ . . . $T_{24}$. To each subregion 71, 721 . . . 724 is assigned a subtransistor $T_1$, $T_{21}$ . . . $T_{24}$, to which the subregion 71, 721 . . . 724 is connected in that the subregion 71, 721 . . . 724 is merged with the base region 4 thereof. The base regions 4 of the subtransistors include n-type emitter regions, which are each connected to a conductor track 9. The conductor track 9 leads to a contact surface 10, at which the output signal of the element A can be derived.

When the laser beam S has been focused on the information carrier, the parasitic capacitance of the element is limited to the capacitance of the further subregions to which the beam is then directed, which further regions are in the Figure, by way of example, the inner subregions 722, 723. An advantage of the further subdivision of the second subregion with respect to a reduction thereof is that in this case no stringent requirements need be imposed on the alignment of the beam S with respect to the further subregions 721 to 724. The parasitic capacitance of the element A, B, C, D in focus is limited to the capacitance of the further subregions 722, 723, which are illuminated, irrespective of which these subregions are in a specific case. The non-exposed further subregions 721, 724 for the same reason as the first subregion 71 do not contribute in this condition to the parasitic capacitance of the element A.

Figure 5:
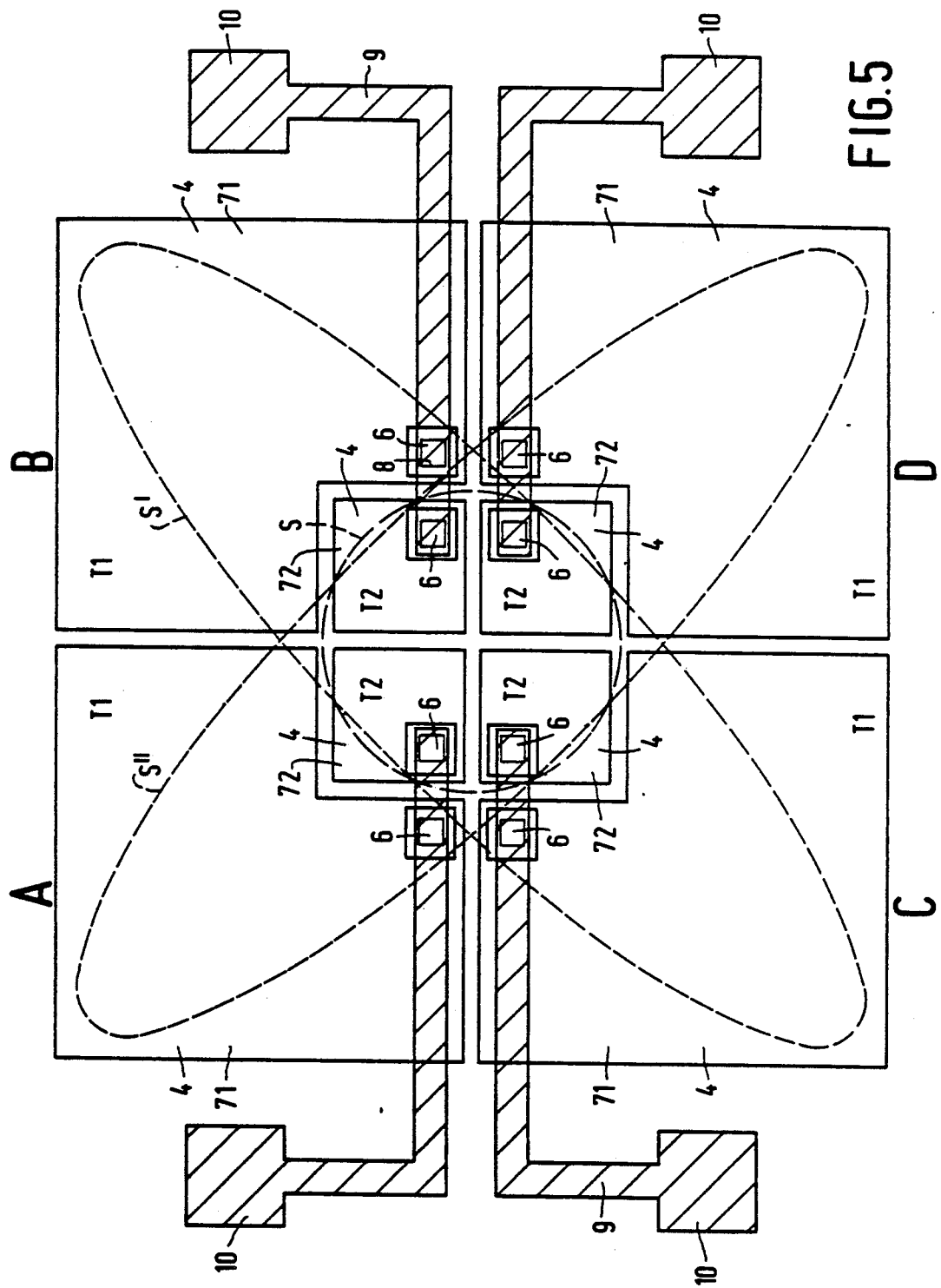
FIG. 5 shows a fourth embodiment of the semiconductor device according to the invention in plan view.

FIG. 5 shows a fourth embodiment of the semiconductor device according to the invention, which is particularly suitable for use in a so-called astigmatic focusing system. This focusing system is frequently used, like the Foucault system, in arrangements for optical recording. The beam S reflected by the information carrier is passed in this case through an astigmatic lens before it is supplied to the system of four radiation-sensitive elements A, B, C, D. As a result, the beam S is substantially circular when the beam has been focused on the information carrier and the beam has the form of an ellipse S' and S" when the focusing plane is located above and below the plane of the information carrier, respectively.

In this embodiment, the device comprises four radiation-sensitive elements A, B, C, D each having a radiation-sensitive region, which is subdivided according to the invention into two subregions 71, 72. A subtransistor $T_1$ and $T_2$, respectively, of the element A, B, C, D is assigned to each subregion 71, 72, the base regions 4 thereof being connected to the subregion 71 and 72, respectively, in that they are merged therewith. The base regions 4 are provided in a common collector region 2, which is constituted by an n-type epitaxial silicon layer, and are each provided with an n-type emitter region 6 disposed therein. The n-type emitter regions 6 are interconnected per element A, B, C, D and are connected via a conductor track 9 to a contact surface 10.

The radiation-sensitive subregions 71, 72 of the various elements A..D are arranged so that the first subregions 71 enclose a central part, in which the second subregions 72 are located and within which the laser beam S falls when the beam has been focused on the information carrier. The parasitic capacitance of the element A, B, C, D is then limited to the capacitance of the second subregion 72 thereof.

Out of focus, the elliptical laser beam S' and S", respectively, extends over two of the four elements A..D. The beam S' and S", respectively, can be trapped with the overall radiation-sensitive surface of the irradiated elements B, C and A, D, respectively, which is constituted by the sum of the surfaces of the subregions 71, 72 thereof. In the same manner as in a Foucault focusing system, a reading signal, a focus error signal and a tracking signal can be derived from the output signals of the elements A, B, C, D.

The embodiments of the invention described above are given only by way of example. The invention is not limited at all to these embodiments, however. Within the scope of the invention, many further variations are possible for those skilled in the art.

For example, instead of silicon, also another semiconductor material may be used for the semiconductor device, such as, for example, germanium or an $A_{III}$—$B_V$ compound, more particularly GaAs. In this case, by a suitable choice of the semiconductor material, the device can be tuned to the wavelength of the radiation to be detected. Moreover, in the semiconductor body, the aforementioned conductivity types may be replaced by the opposite conductivity types.

Besides, the radiation-sensitive junction need not be a pn junction in the same material, as in the embodiments given, but the radiation-sensitive junction may also be constituted by a hetero junction, such as, for example, a GaAs-AlGaAs junction or a hetero junction with silicon.

For the conductor tracks any conductive material is suitable, except metals and metallic compounds, such as, for example, aluminum, gold and tungsten, and metal silicides, respectively, and also doped semiconductor materials, such as, for example, polycrystalline or amorphous silicon doped with phosphorus. It is more particularly possible to use for the wiring electrically conducting materials, which are transparent to the radiation to be detected, such as, for example, silicon or indium oxide, so that the parts of the radiation-sensitive subregions located below the wiring can also take part in the radiation detection.

The invention is not limited either to a focusing arrangement or to optical recording. The invention can generally be used in any device in which radiation is detected or an optical signal is read. The invention provides the possibility of adequately following the signal up to very high frequencies while maintaining a high output signal as compared with radiation-sensitive diodes.

We claim:

1. A semiconductor device having a semiconductor body provided with a radiation-sensitive element comprising a transistor having an emitter region and a collector region of a first conductivity type and an interposed base region of a second, opposite conductivity type and comprising a radiation-sensitive region forming a rectifying junction with said collector region, which radiation-sensitive region is conductively connected to the base region of the transistor, characterized in that the radiation-sensitive region comprises at least a first subregion and a second subregion, and in that the transistor is subdivided into at least two subtransistors, whose base regions are separately connected to one of the first and second subregions, whose collector regions are interconnected, and whose emitter regions are interconnected.

2. A semiconductor device as claimed in claim 1, characterized in that the second radiation-sensitive subregion has a smaller surface than the first radiation-sensitive subregion.

3. A semiconductor device as claimed in claim 1 or 2, characterized in that the device has a second similar radiation-sensitive element, the radiation-sensitive subregions of both elements being arranged in a row.

4. A semiconductor device as claimed in claim 3, characterized in in that in the row the outer subregions are first subregions and the inner subregions are constituted by second subregions.

5. A semiconductor device as claimed in claim 3, characterized in that an at least substantially similar second row of radiation-sensitive subregions of a third and a fourth radiation-sensitive element is located opposite to the row on a longitudinal side thereof.

6. A semiconductor device as claimed in claim 5, characterized in that the base regions of the radiation-sensitive elements comprise the radiation-sensitive subregions and in that the emitter regions are located on the facing longitudinal sides of the rows in the base regions.

7. A semiconductor device as claimed in claim 1, characterized in that the device comprises at least four radiation-sensitive elements, of which the first radiation-sensitive subregions enclose a central part, in which the second radiation-sensitive subregions are located.

8. A semiconductor device as claimed in claim 1, characterized in that the device comprises at least two radiation-sensitive elements, of which the base regions and the radiation-sensitive subregions are located in the semiconductor body so as to be mutually separated, the base regions being located on an average more closely to each other than the radiation-sensitive base regions.

9. A semiconductor device as claimed in claim 1, characterized in that the second radiation-sensitive subregion is subdivided into further subregions, which are each separately connected to mutually isolated base regions of further subtransistors.

* * * * *